(12) United States Patent
Mlotkowski

(10) Patent No.: US 8,546,192 B2
(45) Date of Patent: Oct. 1, 2013

(54) SYSTEM FOR CLAMPING HEAT SINK

(75) Inventor: Greg Mlotkowski, Grosse Point, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 13/290,727

(22) Filed: Nov. 7, 2011

(65) Prior Publication Data
US 2012/0122279 A1    May 17, 2012

Related U.S. Application Data

(62) Division of application No. 11/607,219, filed on Dec. 1, 2006, now Pat. No. 8,053,888.

(51) Int. Cl.
*H01L 21/78*    (2006.01)
(52) U.S. Cl.
USPC .......................................................... 438/122
(58) Field of Classification Search
USPC .................. 257/E21.499, 718, 704, 706, 717; 438/122, 125, 117
See application file for complete search history.

(56) References Cited

U.S. PATENT DOCUMENTS

2006/0202325 A1*    9/2006    Coico et al. ................... 257/718
2008/0285239 A1    11/2008    Yun

* cited by examiner

*Primary Examiner* — Hoa B Trinh
(74) *Attorney, Agent, or Firm* — Brooks Kushman P.C.

(57) ABSTRACT

A system for clamping a heat sink that prevents excessive clamping force is provided. The system may include a heat sink, a semiconductor device, a printed circuit board, and a cover. The semiconductor device may be mounted onto the circuit board and attached to the cover. The heat sink may be designed to interface with the semiconductor device to transfer heat away from the semiconductor device and dissipate the heat into the environment. Accordingly, the heat sink may be clamped into a tight mechanical connection with the semiconductor device to minimize thermal resistance between the semiconductor device and the heat sink. To prevent excessive clamping force from damaging the semiconductor device, loading columns may extend between the cover and the heat sink.

8 Claims, 6 Drawing Sheets

SYSTEM FOR CLAMPING HEAT SINK

BACKGROUND OF THE INVENTION

1. Technical Field

The present invention is generally related to a system for clamping a heat sink. More specifically, the invention relates to a system for clamping a heat sink that prevents excessive clamping force.

2. Related Patents

This application is a divisional of U.S. patent application Ser. No. 11/607,219, titled "SYSTEM FOR CLAIMPING HEAT SINK," filed on Dec. 1, 2006, now U.S. Pat. No. 8,053,888 and is incorporated by reference in this application in its entirety.

3. Related Art

When performing various functions, integrated circuits tend to generate heat. The integrated circuit may be cooled by dissipating heat into the surrounding environment. Particularly in the audio electronics industry, the market has required manufacturers to provide smaller electronic packages along with improved audio performance and power. To improve heat dissipation, heat sinks or blocks of metal may be connected with semiconductor devices to conduct heat away from the semiconductor device and provide a larger surface area from which to dissipate the heat. The heat sink often include fins to increase the surface area for heat dissipation and may even include a channel that provides fluid cooling. This may be particularly important with regard to power amplifiers and audio circuits, as they can generate a significant amount of heat and may require cooling to maintain audio performance of the electronic component.

When attaching a heat sink to the semiconductor device, it may be important to have a tight mechanical coupling of the surface of the heat sink with the surface of the semiconductor device to minimize thermal resistance when transferring heat from the semiconductor device to the heat sink. Often, the components must be securely attached in a manner that will withstand harsh vibration and shock. For example, harsh shock and vibration are often encountered in an automotive audio environment. However, clamping the semiconductor device with excessive force can cause damage to the semiconductor device. Accordingly, there is a need to control the force used in securely clamping a heat sink to a semiconductor device.

SUMMARY

This invention provides a system for clamping a heat sink that prevents excessive clamping force. The system may include a heat sink, a semiconductor device, a printed circuit board, and a cover. The semiconductor device may be mounted onto the circuit board and attached to the cover. The heat sink may be designed to interface with the semiconductor device to transfer heat away from the semiconductor device and dissipate the heat into the environment. Accordingly, the heat sink may be clamped into a tight mechanical connection to minimize thermal resistance between the semiconductor device and the heat sink.

The clamping may be accomplished using bolts that are inserted through openings in the cover and threaded into the heat sink. Tightening the bolts may apply a clamping force that presses the heat sink against the semiconductor device. To prevent excessive clamping force from damaging the semiconductor device, loading columns may extend between the cover and the heat sink. The loading columns serve as a stop or structural support that act against the clamping force when the bolts are torqued. In addition, a button may be formed in the cover beneath the semiconductor device to act as a support for the semiconductor device. Further, a teardrop shaped support may be formed in the cover to support the printed circuit board. The teardrop shaped support may include a head portion with bolt openings and a tail portion that extends toward the semiconductor device to support the printed circuit board.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
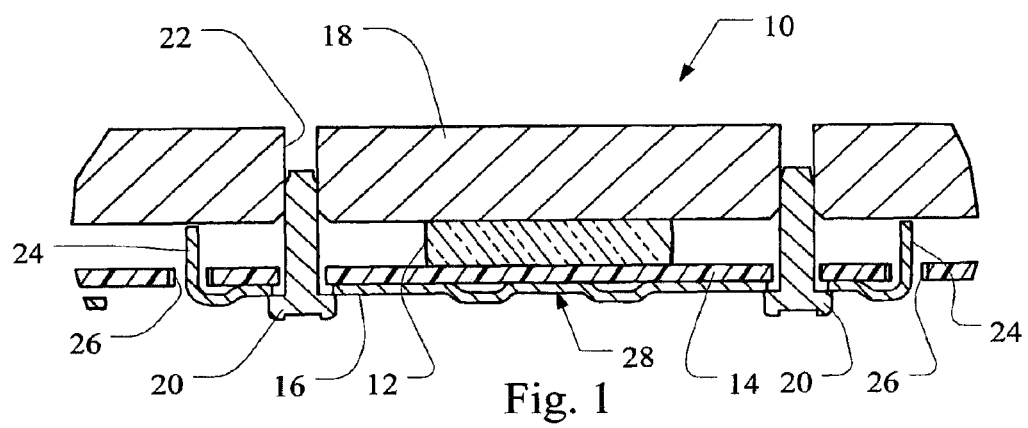
FIG. 1 is a sectional front view of a system for clamping a heat sink.

In FIG. 1, an example of an electronic assembly 10 is provided. The electronic assembly 10 may include a semiconductor device 12, a circuit board 14, a heat sink 18 and a cover 16. The semiconductor device 12 may be in the form of a power amplifier or other semiconductor device that generates heat during usage. These devices often include a ceramic casing and metal pins or pads for facilitating electrical connection. One such device may be the TDA8594J amplifier from PHILIPS electronics. Accordingly, the heat sink 18 may be provided to receive heat from the semiconductor device 12. The heat sink 18 transfers heat away from the semiconductor device 12 and provides an increased surface area allowing improved dissipation of the heat into the environment of the electronic assembly 10.

The electronic assembly 10 may also include a circuit board 14 such as a printed circuit board to which the semiconductor device 12 may be mounted. The circuit board 14 may be made of a plastic and may include metal traces that may be coupled to the semiconductor device 12. The traces may provide electrical power as well as data signals, such as audio data signals, and/or control signals to the semiconductor device 12 for processing. In addition, the circuit board 14 may include additional traces for communicating output signals, such as audio signals, to other components or a speaker system after processing. A cover 16 extends around and protects the circuit board 14 and semiconductor device 12. The cover 16 may be formed from a metal sheet, for example, through a series of forming or stamping events. The cover may be made of from any rigid material such as a steel or other metal, although the cover may also be made from other deformable materials such as plastic or a fibrous material. The cover may include a corrosion resistant plating. For example, the cover can be made of a steel sheet with a thickness of 1.0 mm and including a zinc coating. The cover 16 includes loading columns 24 that extend from an outer surface of the cover through a hole in the circuit board 14 toward the heat sink 18. The loading columns 24 prevent the application of excessive clamping force on the heat sink 18. As such, the loading columns 24 provide structural support to the heat sink 18 and prevent damage to the semiconductor device 12.

Figure 2:
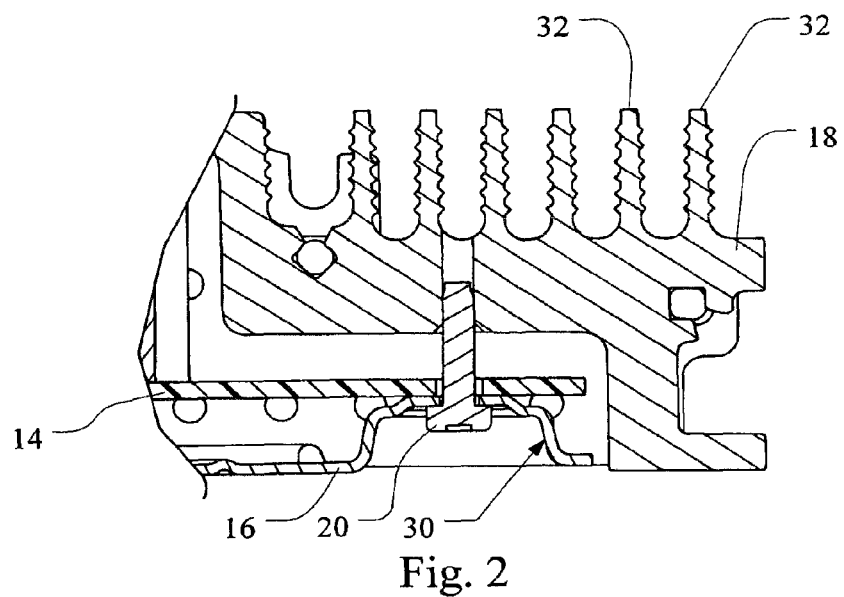
FIG. 2 is a sectional side view of a system for clamping a heat sink.

The heat sink 18 may be clamped to the semiconductor device 12 using a fastener 20. In FIGS. 1 and 2, the fastener 20 is shown as a bolt that may be threaded into a bore 22 formed in the heat sink 18. Accordingly, the fastener 20 extends through an opening in the cover 16, continues through an opening in the circuit board 14, and engages the heat sink 18. As mentioned, the fastener 20 may engage the heat sink 18 through a threaded engagement. Screws, rivets, clamps or any other fasteners may also be readily used. In the bolt arrangement shown, providing increased torque on the fastener 20 generates additional clamping forces by compressing the semiconductor device 12 between the heat sink 18 and the cover 16. As shown in FIG. 1, the loading columns 24 and fastener arrangement may be provided at multiple locations around the semiconductor device 12, for example on the opposite sides of the semiconductor device 12 to securely balance compression of the heat sink 18 against the semiconductor device 12. The columns 24 may extend slightly above the semiconductor device 12 requiring compression of the columns 24. Alternatively, the columns 24 may extend flush with or below the semiconductor device 12. Similarly, the columns 24 may all be the same length or may be different lengths thereby providing additional support as the compression increases. In addition, a button 28 may be formed in the cover 16 to act as a spring between the cover 16 and the semiconductor device 12 to absorb forces that may otherwise over compress the semiconductor device 12. Further, the button 28 may have a rounded or generally dome shape causing the bend of the sheet metal to act as a deformable spring. Further, the button 28 may include a flat top surface that reacts with the semiconductor device 12 through the printed circuit board 14. As such, the cover 16 forms a planar surface and a button 28 extends from the planar surface and forms a second planar surface parallel to the first planar surface that reacts with the semiconductor device 12. Further, the loading columns 24 also extend from the planar surface and may be formed substantially perpendicular to a planar surface. It is also understood that other deformable springs for example, leaf springs or coil springs may be used in place of the button 28 to absorb forces. However, the button 28 may be integrally formed in the cover 16. As may further be seen in FIG. 2, the heat sink 18 may include fins 32 extending away from the semiconductor device 12 providing additional surface area to improve heat dissipation through convection cooling. In addition, the fastener 20 may be located in a channel 30 formed in the cover 16.

Figure 3:
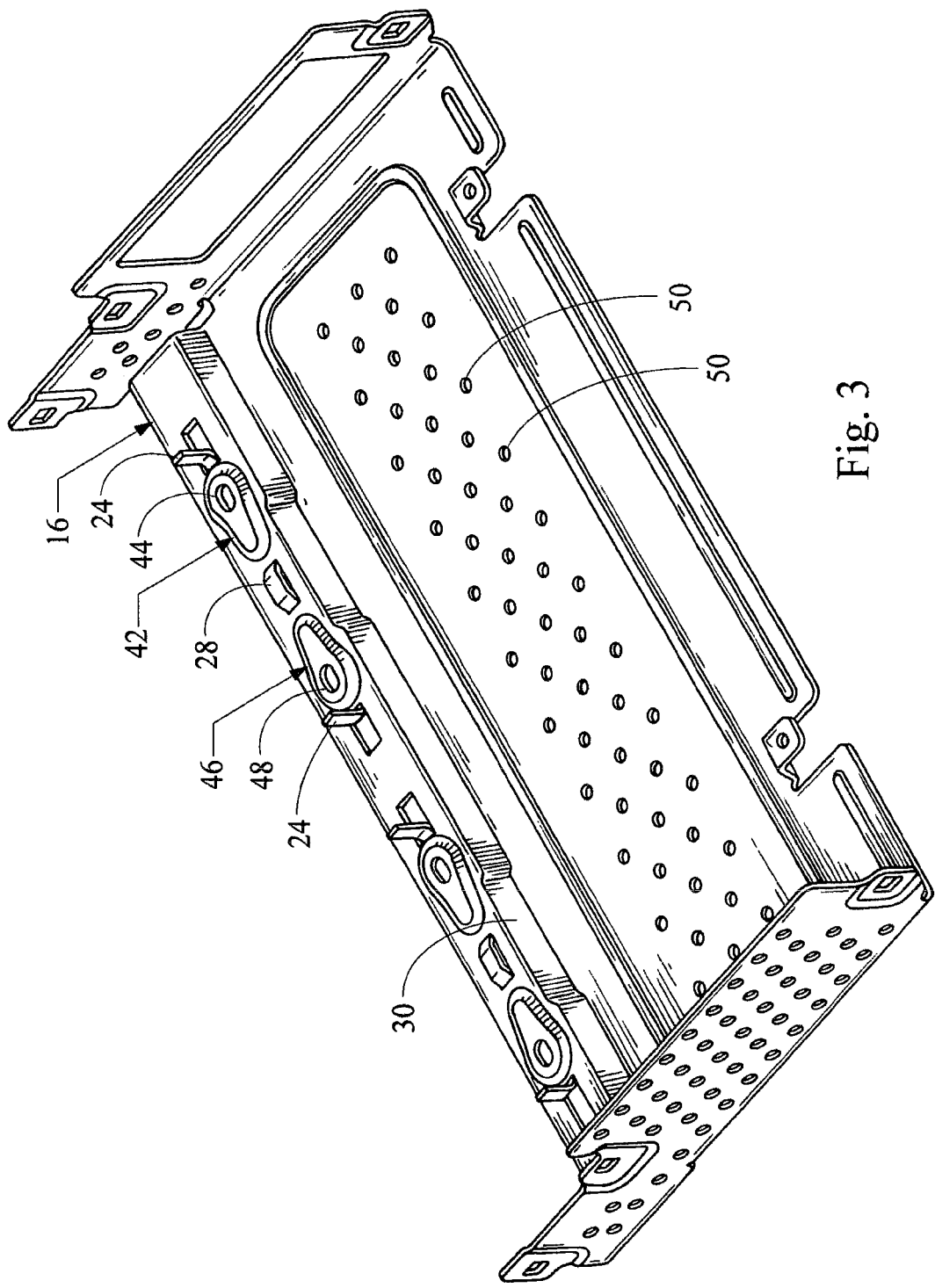
FIG. 3 is a perspective view of a cover for an electronic assembly.
Figure 4:
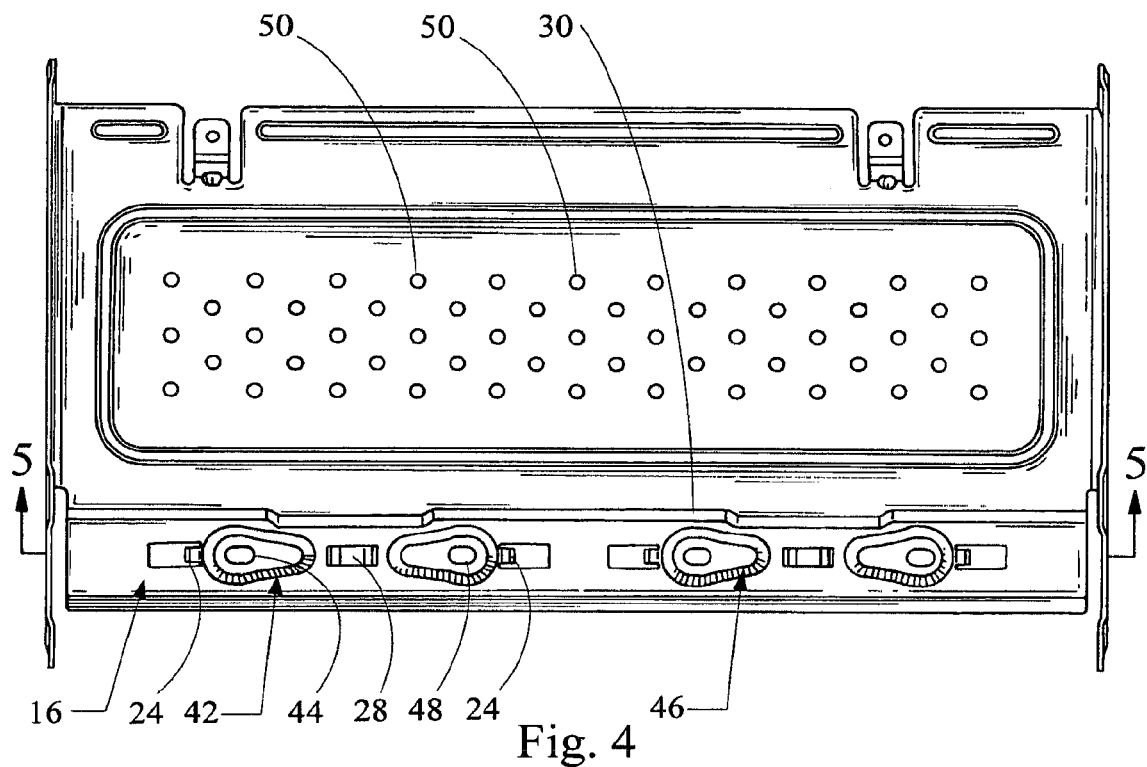
FIG. 4 is a top plan view of a cover for an electronic assembly.
Figure 5:
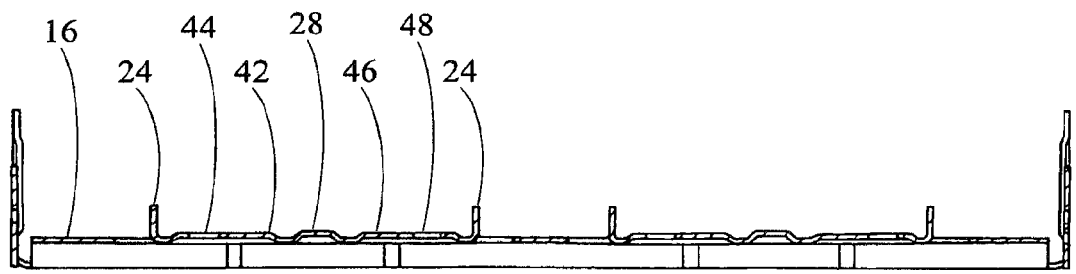
FIG. 5 is a sectional front view of the cover in FIG. 4.

In FIGS. 3, 4 and 5, additional views of the cover 16 from FIG. 2 are provided. The cover 16 may extend along and around the printed circuit board 14 and may include cooling holes 50 allowing for the flow of air for convection cooling of the heat sink 18, semiconductor device 12, and the circuit board 14. The cover 16 may interface with another housing portion that forms part of the heat sink 18 (seen in FIG. 2). The cover 16 may surround and protect the components of the electronic assembly including the circuit board 14 and the semiconductor device 12. The cover 16 may be formed of a metal sheet through various stamping and forming processes. The trench 30 may be formed across the cover and may be used for housing multiple semiconductor devices, for example a pair of power amplifiers. The button 28 may be stamped into the cover forming a rounded domed configuration including a flattened top surface providing a more stable mechanical interface. The button 28, as described previously, may act as a spring against semiconductor device 12 to absorb the clamping force. In a similar manner, the loading columns 24 may be stamped into cover 16 and bent perpendicular to a top surface of the trench 30 to absorb additional clamping force and prevent over clamping of the heat sink 18 and damage to the semiconductor device 12. In addition, a recess 42 may be formed in the cover 16 for supporting the circuit board 14 and distributing the force from the fastener 20 across the circuit board 14. The recess 42 may extend from the planar surface of the cover 16 toward the circuit board 14. The recess 42 may include a flat surface parallel to the planar surface that is elongated and extends towards the middle of the semiconductor device 12 to provide additional support for the semiconductor device 12. As such, the recess 42 may have a generally teardrop shape with the head of the teardrop surrounding the fastener opening 44 and the tail of the teardrop extending towards the middle of the semiconductor device 12. This configuration may be mirrored on the opposite side of the cover 16 as denoted by recess 46 and fastener opening 48, symmetrically forming a generally teardrop shape with the tail extending towards the semiconductor device 12. Other shapes for the recess may also be used, such as ovals or polygons, however the teardrop shape may provide improved support due to support by the head of the screw on one end and the converging tail lines on the opposite end. Although the cover 12, as shown in FIGS. 3-5, is configured to accommodate two semiconductor devices, it is readily understood that multiple additional semiconductor devices could be accommodated by duplicating this arrangement in various additional locations along the cover 16. Alternatively, a single semiconductor device may be accommodated in a single location on the cover 16.

Figure 6:
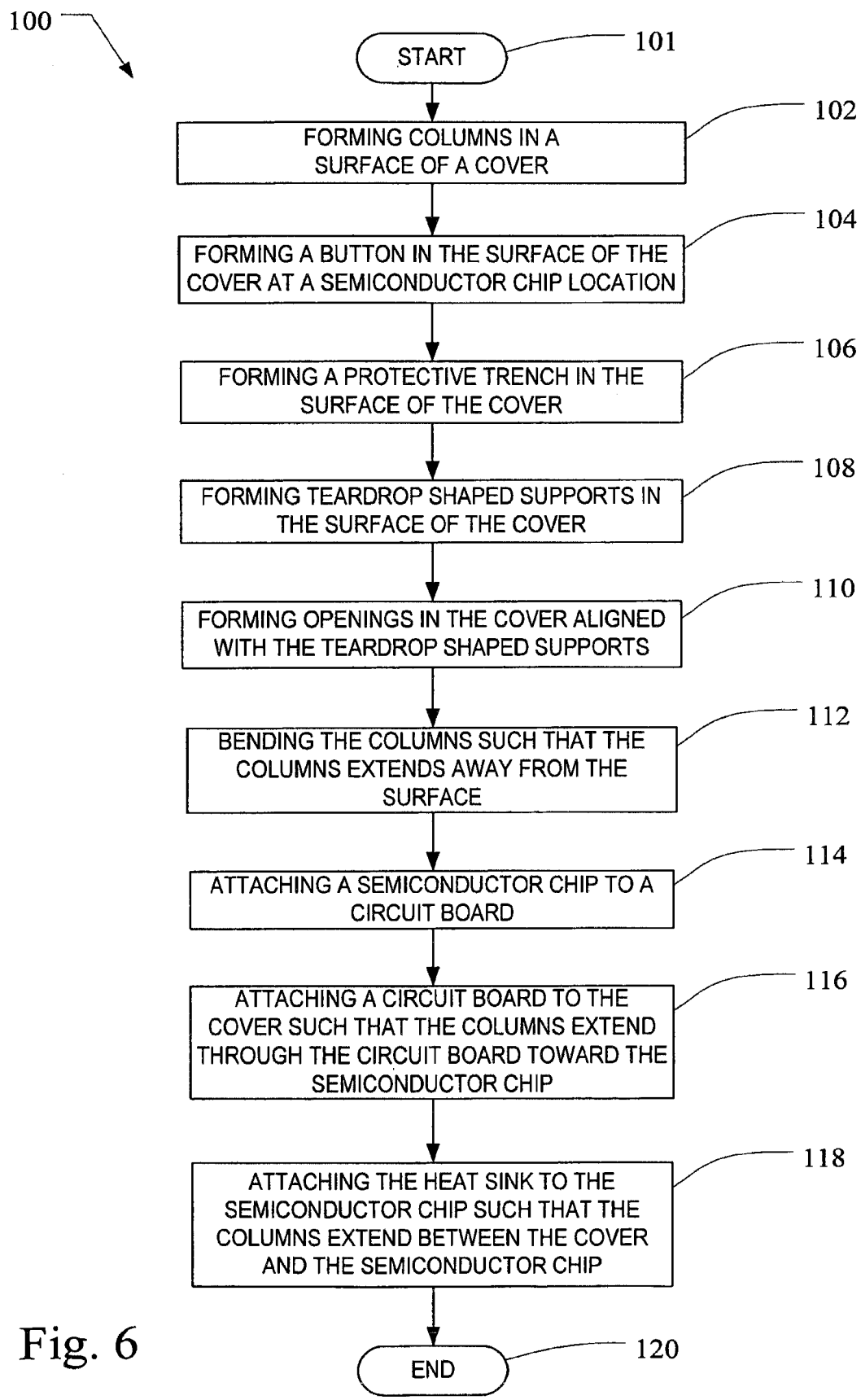
FIG. 6 is a flowchart illustrating a method for clamping a heat sink.

In FIG. 6, an example method 100 is provided for clamping a heat sink 18 to a semiconductor device 12. The method starts in block 101. The cover 16 may be formed from a sheet of metal through various stamping operations. In block 102, one or more columns 24 may be formed in a surface of the cover 16. At this stage, the column(s) 24 may resemble a strip parallel with the surface extending into an opening formed in the surface of the sheet. In block 104, a button 28 may be formed in the surface of the sheet at a semiconductor device location. Further, if two columns are used, the columns 24 may be juxtaposed and the button 28 may be formed in between the two columns 24. The button 28 may be formed by stamping a portion of the surface into a dome shape. Alternatively, slits may be stamped in the surface and a portion of the surface between the slits may be bent and/or stretched outwardly into a curved shape. Further, the top of the button may be formed into a flat surface that is configured to interface with a surface of the circuit board 14 or semiconductor device 12. In block 106, teardrop shape supports 42 may be formed in the surface of the cover. Openings 44 may be formed in the cover 16 to be aligned with the teardrop shape supports 42 as denoted by block 108. In block 110, a trench 30 may be formed in the surface of the cover 16 such that the columns 24, the button 28, and the supports 42 are located in the trench and generally protected by other extended surfaces of the cover 16. In block 112, the columns may be bent such that columns 24 extend away from the surface of the cover 16. For example, the columns 24 may extend at approximately a 90° angle with respect to the surface of the cover 16 allowing the columns 24 to extend between the surface of the cover 16 and the heat sink 18 during later assembly steps. The semiconductor device 12 may be attached to a circuit board 14 as denoted in block 114. In block 116, a circuit board 14 may be attached to the cover 16 such that the columns 24 extend through the circuit board 14 upwardly around the semiconductor device 12. The heat sink 18 may be attached to the semiconductor device 12 such that the columns 24 extend between the cover 16 and the heat sink 18 as denoted by block 118. The heat sink 18 may be attached to the semiconductor device 12 utilizing fasteners 20 such as bolts that extend through openings 42 in the cover 16 and thread into the heat sink 18. When the bolts 20 are tightened, the columns 24 provide a structural support acting to relieve the clamping force against the semiconductor device 12. In this configuration, the button 28 and the teardrop shape supports 42 serve to support the circuit board 14 and semiconductor device 12 thereby reducing flex or stress imposed upon the assembly. The end of the method is denoted by block 120.

Figure 7:
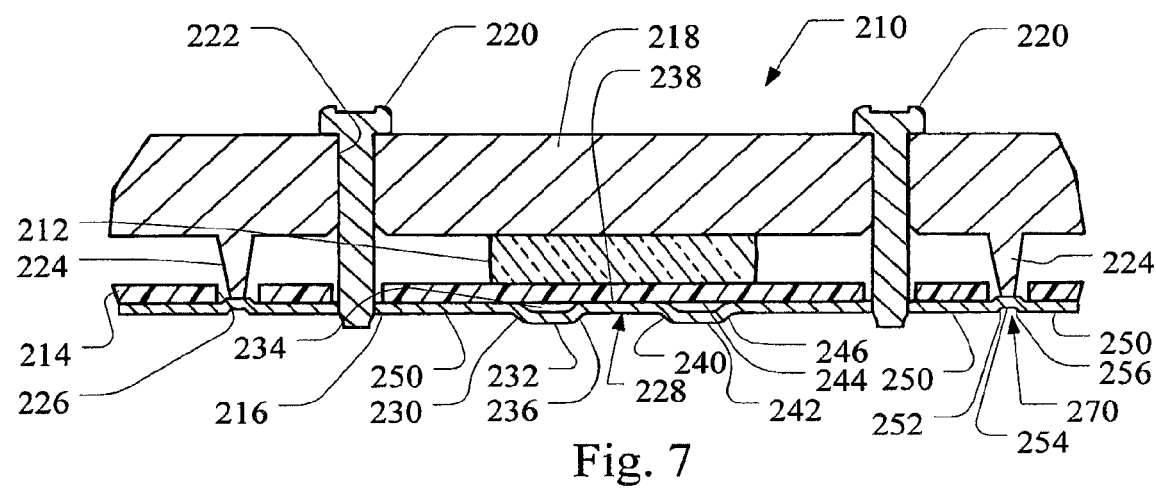
FIG. 7 is a sectional front view of another embodiment of a system for clamping a heat sink.

In FIG. 7, another example of an electronic assembly 210 is provided. The electronic assembly 210 may include a semiconductor device 212, a circuit board 214, a heat sink 218, and a cover 216. The heat sink 218 may be provided to receive heat from the semiconductor device 212. The electronic assembly 210 may also include a circuit board 214 such as a printed circuit board to which the semiconductor device 212 may be mounted. Traces on the circuit board 214 may provide electrical power as well as data signals and/or control signals to the semiconductor device 212. A cover 216 extends about and protects a circuit board 214 and the semiconductor device 212. The cover 216 may be formed from a sheet metal for example, through a series of forming or stamping events. The cover may be made from any rigid material, for example metal, plastic, or other similar material. The heat sink 218 may be clamped to the semiconductor device 212 using a fastener 220. The fastener 220 is shown as a bolt. Although the fastener 220 may be threaded into the heat sink 218 as depicted in FIG. 1, alternatively, in any of the embodiments discussed, the fastener 220 may pass through a bore 222 in the heat sink 218 and be threaded into the cover 216. Alternatively, the fastener 220 may extend through the cover 216 and be threaded into a nut on an opposite side of the cover 216 from the heat sink 218.

The heat sink 218 may include columns 224 that extend around the semiconductor device 212 to absorb force from over clamping of the heat sink 218 by the fasteners 220. In other alternative embodiments, the columns may be independent spacers extending between the cover and the heat sink. The columns 224 may extend through openings 226 in the circuit board 214 to contact the cover 216. In particular, the columns 224 may contact buttons 270 formed in the cover 216 that also act to absorb over clamping of the heat sink 218. Buttons 270 may include a first segment 252 of the cover 216 that extends angularly towards the heat sink 218 with respect to a planar region 250 of the cover that is generally parallel to the heat sink 218. The button 270 forms a top surface 254 that is substantially parallel to the planar region 250 and aligned to interact with the column 224 of the heat sink 218. Similar to the first segment 252, button includes a second segment 256 that is angularly formed with respect to the planar region 250 and that extends between the top surface 254 and the planar region 250 thereby forming the button 270.

The cover 216 may also include a button 228 aligned with the center of the semiconductor device 212. The button 228 may be surrounded by a planar region 250 of the cover 216. The button 228 may include a first segment 230 that extends angularly away from the integrated circuit 212 and that is connected to a planar portion 232 that is substantially parallel to the planar portion 250 of the cover 216. The planar portion 232 may be connected to a second segment 336 that extends angularly toward the semiconductor device 212, between the planar portion 232 and a planar surface 238. The planar surface 238 may be substantially parallel to the planar region 250 of the cover 216, as well as, the circuit board 214 and the semiconductor device 212. Accordingly, the surface 238 is configured to interact with the circuit board 214 or the semiconductor device 212 through the circuit board 214. In addition, it can be readily understood that the surface 238 may directly support the semiconductor device 212 as described in other embodiments provided below. The first segment 230 and the second segment 236 may cause a gap 234 to be formed between the cover 216 and the circuit board 214. Similarly, a third segment 240 may extend angularly between the planar surface 238 and a planar segment 244 that is substantially parallel to the planar region 250, similar to segment 232. A fourth segment 246 extends between the planar segment 242 and the planar region 250 forming a gap 244 between the cover 216 and the circuit board 214, similar to gap 234. The segments of the button 228 act together as a deformable spring to absorb any over clamping force and prevent damage to the semiconductor device 212.

Figure 8:
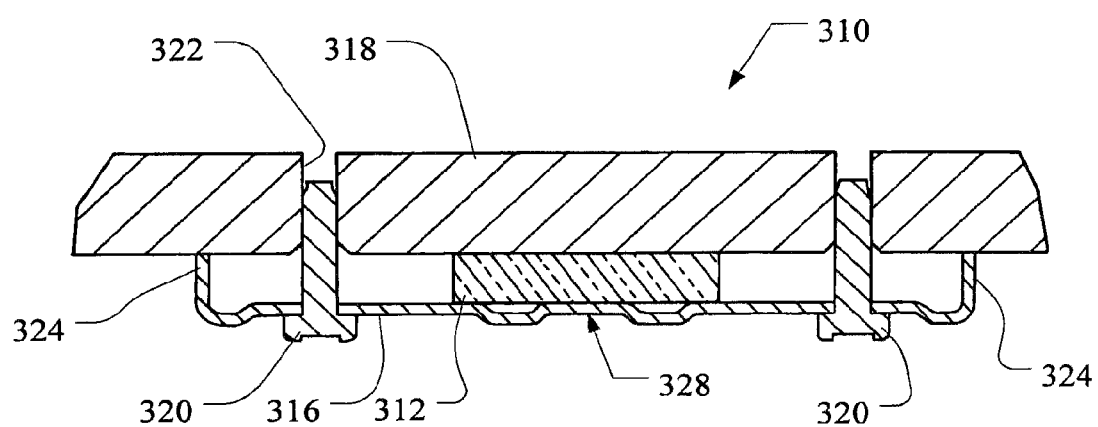
FIG. 8 is another sectional front view of yet another embodiment of a system for clamping a heat sink.

In FIG. 8, another example of an electronic assembly 310 is provided. The electronic assembly 310 may include a semiconductor device 312, a heat sink 318, and a cover 316. The heat sink 318 may be provided to receive heat from the semiconductor device 312. A cover 316 may extend about and protect the semiconductor device 312. The cover 316 may be formed from a metal sheet, for example, through a series of forming or stamping events. The cover 316 may be made from any rigid material, for example metal, plastic, or other similar material. The heat sink 318 may be clamped to the semiconductor device 312 using a fastener 320. The fastener 320 is shown as a bolt that may be threaded into a bore 322 formed in the heat sink 318. Accordingly, the fastener 320 extends through an opening in the cover 316 and engages the heat sink 318. As mentioned, the fastener 320 may engage the heat sink 318 through a threaded engagement. Screws, rivets, clamps or any other fasteners may readily be used. In the bolt arrangement shown, providing increased torque on the fastener 320 generates additional clamping forces by compressing the semiconductor device 312 between the heat sink 318 and the cover 316.

Loading columns 324 may extend from the cover 316 toward the heat sink 318 to absorb compression force if the semiconductor device 312 is cover compressed. The loading columns 324 and fastener arrangement may be provided at multiple locations around the semiconductor device 312, for example on the opposite sides of the semiconductor device 312 to securely balance compression of the heat sink 318 against the semiconductor device 312. In addition, a button 328 may be formed in the cover 316 to act as a spring between the cover 316 and the semiconductor device 312 to absorb forces that may otherwise over compress the semiconductor device 312. Further, the button 328 may have a rounded or generally dome shape causing the bend of the sheet metal to act as a deformable spring. Further, the button 328 may include a flat top surface that contacts the semiconductor device 312. As such, the cover 316 forms a planar surface and a button 328 extends from the planar surface and forms a second planar surface parallel to the first planar surface that reacts with the semiconductor device 312. Further, the loading columns 324 also extend from the planar surface and may be formed substantially perpendicular to a planar surface. It is also understood that other deformable springs for example, leaf springs or coil springs may be used in place of the button 328 to absorb forces. However, the button 328 may be integrally formed in the cover 316. The button 328 may act as a deformable spring to absorb any over clamping force and prevent damage to the semiconductor device 312.

Figure 9:
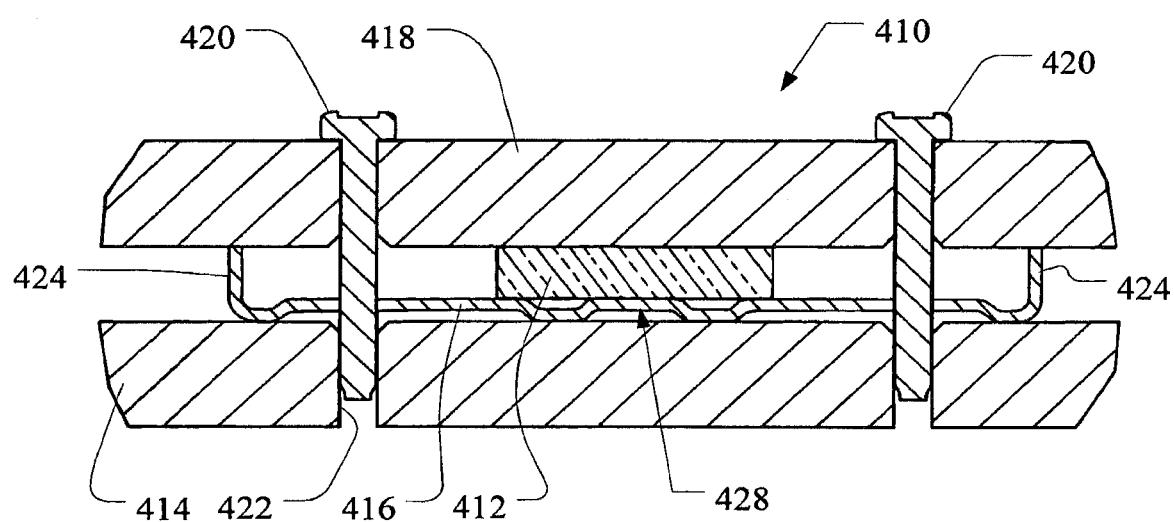
FIG. 9 is another sectional front view of yet another embodiment of a system for clamping a heat sink.

In FIG. 9, another example of an electronic assembly 410 is provided. The electronic assembly 410 may include a semiconductor device 412, a first heat sink 418, a second heat sink 414, and a cover 416. The first and second heat sink 418 and 414 may be provided to receive heat from the semiconductor device 412. A cover 416 may extend about and protect the semiconductor device 412. The cover 416 may be formed from a metal sheet, for example, through a series of forming or stamping events. The cover 416 may be made from any rigid material, for example metal, plastic, or other similar material. The first and second heat sink 418, 414 may be clamped to the semiconductor device 412 using a fastener 420. The fastener 420 is shown as a bolt that may extend through the first heat sink 418 and be threaded into a bore 422 formed in the second heat sink 414. Accordingly, the fastener 420 extends through an opening in the cover 416 and engages the second heat sink 414. In the bolt arrangement shown, providing increased torque on the fastener 420 generates additional clamping forces by compressing the semiconductor device 412 between the first and second heat sink 418, 414.

Loading columns 424 may extend from the cover 416 toward the heat sink 418 to absorb compression force if the semiconductor device 412 is cover compressed. The loading columns 424 and fastener arrangement may be provided at multiple locations around the semiconductor device 412, for example on the opposite sides of the semiconductor device 412 to securely balance compression of the heat sink 418 against the semiconductor device 412. In addition, a button 428 may be formed in the cover 416 to act as a spring between the cover 416 and the semiconductor device 412 to absorb forces that may otherwise over compress the semiconductor device 412. Further, the button 428 may have a rounded or generally dome shape causing the bend of the sheet metal to act as a deformable spring. Further, the button 428 may include a flat top surface that reacts with the semiconductor device 412 through the printed circuit board 414. As such, the cover 416 forms a planar surface and a button 428 extends from the planar surface and forms a second planar surface parallel to the first planar surface that reacts with the semiconductor device 412. Further, the loading columns 424 also extend from the planar surface and may be formed substantially perpendicular to a planar surface. It is also understood that other deformable springs for example, leaf springs or coil springs may be used in place of the button 428 to absorb forces. However, the button 428 may be integrally formed in the cover 416. The button 428 may act as a deformable spring to absorb any over clamping force and prevent damage to the semiconductor device 412.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A method for clamping a heat sink, the method comprising:
    forming columns in a surface of a sheet metal cover that extend away from the surface by bending portions of the sheet metal cover;
    positioning a circuit board that includes a semiconductor device adjacent to the cover such that the columns extend past the circuit board adjacent to the semiconductor device;
    positioning a heat sink to be in contact with the semiconductor device such that columns extend between the cover and the heat sink; and
    clamping the semiconductor between the cover and the heat sink.

2. The method of claim 1 further comprising forming a button in the surface of the cover in a location proximate the semiconductor device.

3. The method of claim 2 wherein the button is operable as a spring that extends from the cover and is generally aligned with the semiconductor device.

4. The method of claim 1 wherein the columns are positioned at multiple locations around the semiconductor device.

5. The method of claim 1 further comprising extending a fastener through the cover and engaging the heat sink to provide a clamping force between the heat sink and the cover.

6. A method for clamping a heat sink, the method comprising:
    bending portions of a cover away from a cover surface to form columns that extend away from the surface of the cover;
    positioning a circuit board that includes a semiconductor device adjacent to the cover such that the columns extend through the circuit board;
    positioning a heat sink to be in contact with the semiconductor device such that the columns extend between the cover and the heat sink; and
    clamping the semiconductor between the cover and the heat sink.

7. The method of claim 6 wherein the cover is made of an incompressible material.

8. The method of claim 7 wherein the cover comprises a sheet metal cover.

* * * * *